(12) United States Patent
DiFonzo et al.

(10) Patent No.: US 6,411,505 B1
(45) Date of Patent: Jun. 25, 2002

(54) COMPUTER HOUSING FOR A PORTABLE COMPUTER

(75) Inventors: John C. DiFonzo, Emerald Hills; Andrew S. Healy, Cupertino; Andy Johnston, Redwood City; Sung H. Kim, Palo Alto; Bart Andre, Menlo Park; Mounir M. Itani, San Jose, all of CA (US)

(73) Assignee: Apple Computer, Inc., Cupertino, CA (US)

( * ) Notice: Subject to any disclaimer, the term of this patent is extended or adjusted under 35 U.S.C. 154(b) by 0 days.

(21) Appl. No.: 09/441,146

(22) Filed: Nov. 12, 1999

(51) Int. Cl.$^7$ ............................... G06F 1/16; H05K 7/10
(52) U.S. Cl. ..................... 361/683; 361/686; 439/160; 439/152; 711/115
(58) Field of Search ................................ 361/679–686, 361/724–727; 439/152, 155, 159, 160; 711/115, 2, 5

(56) References Cited

U.S. PATENT DOCUMENTS

| | | | |
|---|---|---|---|
| 4,982,303 A | * | 1/1991 | Krenz ........................ 360/137 |
| 5,466,166 A | | 11/1995 | Law et al. |
| 5,488,522 A | | 1/1996 | Peace et al. |
| 5,510,953 A | | 4/1996 | Merkel |
| 5,515,237 A | * | 5/1996 | Ogami et al. ................ 361/685 |
| 5,574,625 A | * | 11/1996 | Ohgami et al. .............. 361/684 |
| 5,612,831 A | | 3/1997 | Gallo et al. |
| 5,721,669 A | * | 2/1998 | Becker et al. ................ 361/685 |
| 5,737,185 A | * | 4/1998 | Morrison et al. ............ 361/685 |
| 5,740,012 A | * | 4/1998 | Choi ............................ 361/686 |
| 5,809,520 A | * | 9/1998 | Edwards et al. ............. 711/115 |
| 5,812,370 A | | 9/1998 | Moore et al. |
| 5,818,182 A | | 10/1998 | Viswanadham et al. |
| 5,825,616 A | * | 10/1998 | Howell et al. ............... 361/684 |
| 5,841,631 A | * | 11/1998 | Shin et al. .................... 361/684 |
| 5,969,941 A | | 10/1999 | Cho |
| 6,010,344 A | | 1/2000 | Muramatsu et al. |
| 6,049,453 A | * | 4/2000 | Hulsebosch ................. 361/686 |
| 6,115,239 A | | 9/2000 | Kim |

* cited by examiner

*Primary Examiner*—Lynn D. Feild
*Assistant Examiner*—Lisa Lea-Edmonds
(74) *Attorney, Agent, or Firm*—Beyer Weaver & Thomas, LLP

(57) ABSTRACT

Improved housings for computing devices are disclosed. One improvement pertains to a multi-axis ventilation system. Another improvement pertains to a push button latch for a portable computer. Still another improvement pertains to a media bay ejection system provided with a dampener. These improvements can be provided separately or in any combination in a given computing device.

26 Claims, 6 Drawing Sheets

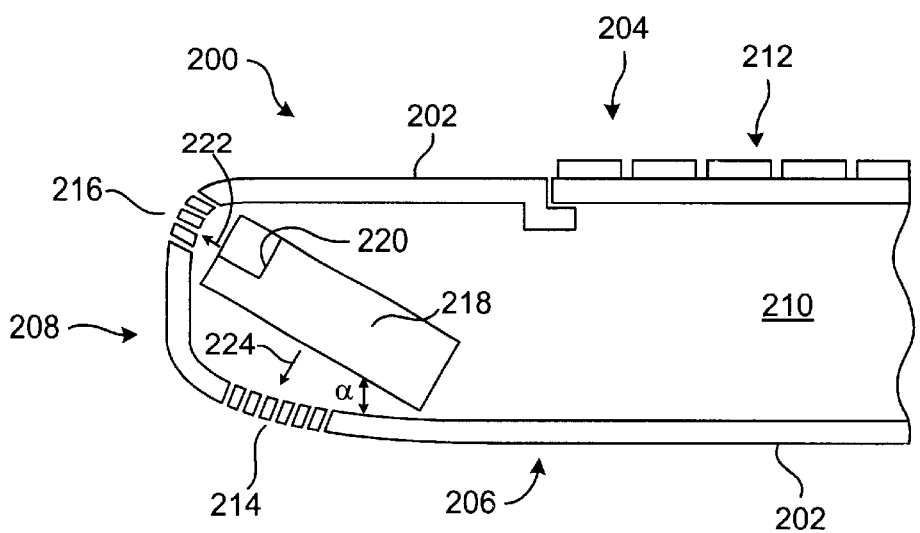
FIG. 2
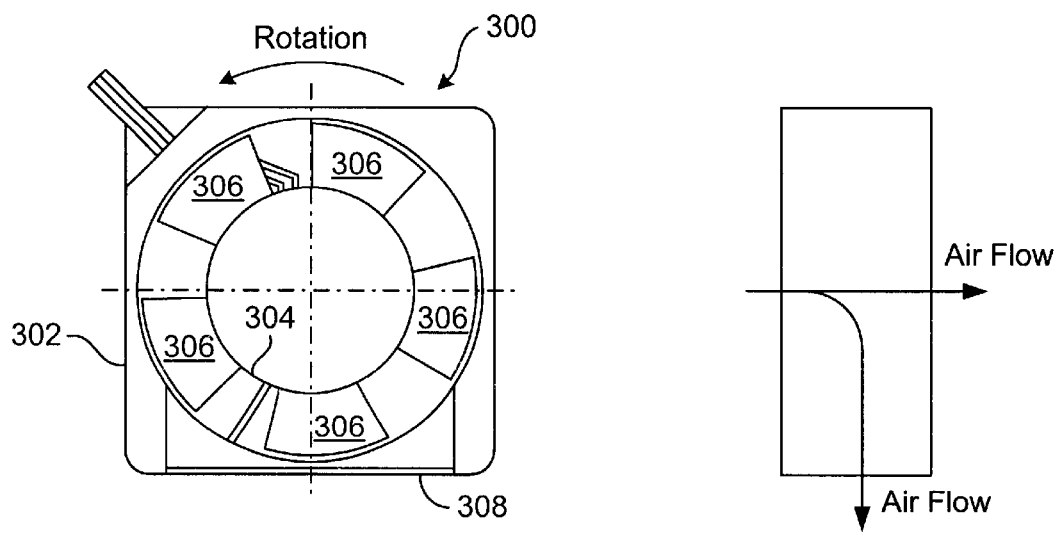
FIG. 3A
FIG. 3C
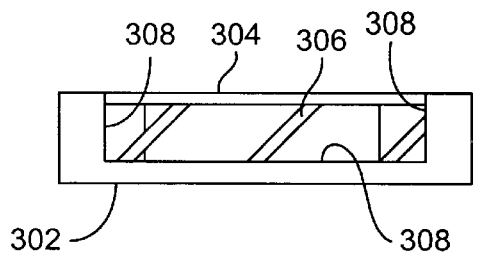
FIG. 3B

COMPUTER HOUSING FOR A PORTABLE COMPUTER

BACKGROUND OF THE INVENTION

1. Field of the Invention

The present invention relates generally to computer systems and, more particularly, to improved features for housings of computer systems.

2. Description of the Related Art

Conventionally, portable computers have been able to mount fans within their base housings in a vertical fashion. When the fans are mounted in this manner, the air flow is easy to control and guide as appropriate. The air flow is used to cool various components internal to the base housing. However, as base housings of portable computers get thinner and thinner, it becomes more and more difficult to mount a fan within the computer housing in a vertical fashion. Moreover, as portable computers get smaller in general, it is much more difficult to provide adequate airflow through base housings of the portable computers.

Often, portable computers provide vents in the base housing. These vents are used for cool air intake or heated air exhaust. Hence, the expelling of heated air from the base housing operates to cool the base housing of the portable computer. Unfortunately, portable computers are often used on soft surfaces that tend to be soft and thus not flat. Such soft surfaces include, for example, carpeting, blankets, pillows, foam surfaces, etc. When portable computers are used on such soft surfaces, vents appearing on the lower portions of the base housing tend to be blocked. Once these vents are blocked, the airflow through the vents is substantially impeded and thus renders it difficult to cool internal components within the base housing of the portable computer. As a result, the base housing gets hotter than desired which is inconvenient for the user and may also lead to overheating or component failure.

In addition, display housings (or lids) of portable computers are conventionally latched to respective base housings using latches provided in the display housing (or lid). In other words, the display housing typically contains a spring-loaded latch mechanism that latches against the base housing. A user would slide the latch mechanism to disengage the latch and thus allow the display housing to be opened. Such conventional approaches have two distinct disadvantages. One disadvantage is that, as portable computers continue to become thinner structures, the display housing thickness decreases, thus making it more and more difficult to provide a latch mechanism in the display housing. The second disadvantage is that the latch provided at the display housing protrudes outward from the front surface of the display housing and has poor aesthetic qualities.

Portable computers conventionally include a media bay to receive various functional components. Typical functional components, known as media devices, that may be inserted into a media bay and thereafter utilized by the portable computer include a digital versatile disk (DVD) drive, a ZIP drive, or a battery. Usually, when a media device is inserted into a media bay, it becomes essentially flush or recessed within an opening of the portable computer that receives the media device. As a result, a user cannot thereafter easily remove the media device from the media bay. In many cases, this is desirable because the media device often semi-permanently resides within the media bay and the user would not want the media device to easily fall out from the media bay.

As such, to remove a media device from a media bay, conventionally a lever, button or sliding latch is provided on an exterior surface of the portable computer that a user could utilize to initiate removal of the media device from the media bay. Buttons and sliding latches are often used when the media device is spring biased to eject itself when released. A lever is often used when the media device is dislodged and removed by the lever action instead of spring bias. However, one disadvantage of using such a conventional lever design to begin an eject or removal process is that the lever, upon being released, would snap back against the surface of the portable computer housing. The snap back would be abrupt and cause a vibration in the housing as well as a snap sound. Consequently, the snap back of the lever tended to leave users with the impression that the portable computer was not a well made, high quality product.

Thus, there is a need for (i) improved media bay ejection systems, (ii) improved approaches to utilize fans within small spaces associated with portable computers, and/or (iii) improved techniques to latch a display housing to a base housing of portable computers.

SUMMARY OF THE INVENTION

Broadly speaking, the invention relates to an improved housing for a computing device. A first aspect of the invention pertains to a multi-axis ventilation system. A second aspect of the invention pertains to a push button latch for a portable computer. A third aspect of the invention pertains to a media bay ejection system provided with a dampener. These aspects of the invention can be provided separately or in any combination in a given computing device.

The invention can be implemented in numerous ways including, as an apparatus, a device, a method, and a computer system. Several embodiments of the invention are discussed below.

As a portable computer, one embodiment of the invention includes: a computer housing for components of the portable computer, the computer housing including a lower vent and an upper vent; and a multi-axis fan provided within the computer housing to cool the components within the computer housing, the multi-axis fan producing airflow in a first direction and a second direction when the multi-axis fan is operational. The airflow in the first direction is substantially directed towards the lower vent of the computer housing, and the airflow in the second direction is substantially directed towards the upper vent of the computer housing.

As a portable computer, another embodiment of the invention includes: a display housing including a display for the portable computer; and a base housing for data processing and data storage components of the portable computer, the base housing including a spring-based latch that serves to latch the display housing against the base housing when the display housing is in a closed position.

As a portable computer, still another embodiment of the invention includes: a media bay capable of receiving a media device; and a computer housing for components of the portable computer. The computer housing including at least a media bay opening providing access to the media bay, and a media ejection mechanism. The media ejection mechanism includes at least a push bar, a dampener and an eject lever. The dampener provides a resistance to rapid movement to the push bar and the eject lever.

As a portable computer, yet another embodiment of the invention includes: a display housing including a display; a media bay capable of receiving a media device; and a computer housing for components of the portable computer. The computer housing including at least a media bay opening providing access to the media bay, and media ejection means for dampening a return action of an ejection lever which ejects a media device from the media bay.

Other aspects and advantages of the invention will become apparent from the following detailed description, taken in conjunction with the accompanying drawings illustrating, by way of example, the principles of the invention.

BRIEF DESCRIPTION OF THE DRAWINGS

The invention, together with further advantages thereof, may best be understood by reference to the following description taken in conjunction with the accompanying drawings in which:

FIG. 2 is a partial cross-sectional diagram of a portable computer according to one embodiment of a first aspect of the invention;

FIGS. 3A–3C are diagrams of a fan according to one embodiment of the first aspect of the invention;

DETAILED DESCRIPTION OF THE INVENTION

The invention pertains to an improved housing for a computing device. A first aspect of the invention pertains to a multi-axis ventilation system. A second aspect of the invention pertains to a push button latch for a portable computer. A third aspect of the invention pertains to a media bay ejection system provided with a dampener. These aspects of the invention can be provided separately or in any combination in a given computing device.

Embodiments of the invention are discussed below with reference to FIGS. 1–6B. However, those skilled in the art will readily appreciate that the detailed description given herein with respect to these figures is for explanatory purposes as the invention extends beyond these limited embodiments.

Figure 1:
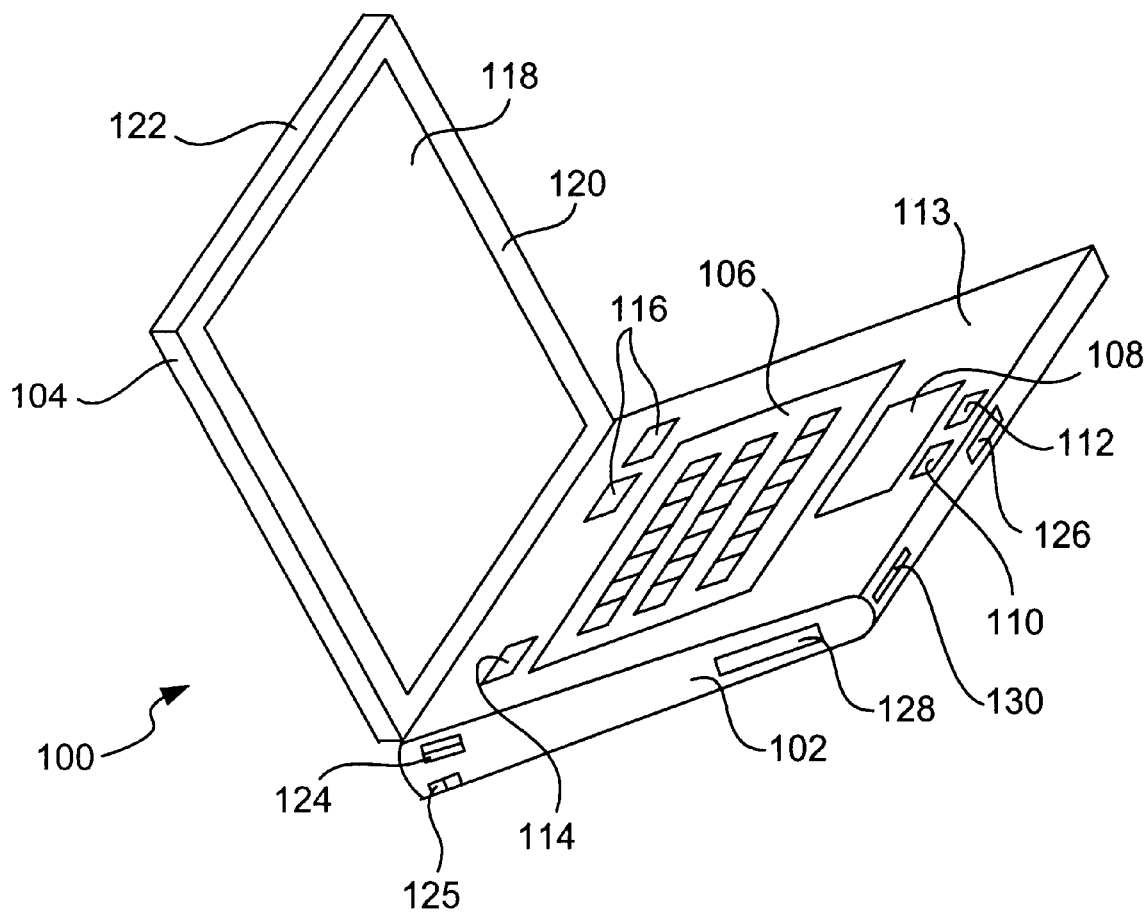
FIG. 1 is a perspective diagram of a portable computer.

FIG. 1 is a perspective diagram of a portable computer 100. The portable computer 100 includes a base 102 and a lid 104. The base 102 houses internally various electrical components (including integrated circuit chips and other circuitry) to provide computing operations for the portable computer 100. The integrated circuit chips and other circuitry include a microprocessor, Read-Only Memory (ROM), Random-Access Memory (RAM), a disk drive, a battery, a circuit board, and various input/output (I/O) support circuitry. The base 102 also includes a keyboard 106 that allows a user of the portable computer 100 to enter alphanumeric data. The base 102 also includes a track pad 108 and associated buttons 110 and 112. The track pad 108 is an input device for the portable computer 100 and generally represents an input pointer device. The associated buttons 110 and 112 allow a user to make a selection with respect to a graphical user interface. The track pad 108 and the buttons 110 and 112 are located in an upper, front area of the base 102 referred to as a palm rest 113. Additionally, the base 102 includes a power switch 114 and miscellaneous switches 116.

The lid 104 is coupled to the base 102 by way of a hinge mechanism (not shown). As such, the lid 104 can rotate into an open position or a closed position with respect to the base 102. As illustrated in FIG. 1, the lid 104 is in the open position. The lid 104 contains a liquid crystal (LCD) display 118. The LCD display 118 is visible to a user of the portable computer 100 when the lid 104 is in the open position, such as illustrated in FIG. 1. The LCD display 118 is used to display the graphical user interface (including perhaps a pointer or cursor) as well as other information to the user. The LCD display 118 is surrounded at a peripheral region by a bezel 120 that serves to support the LCD display 118 in its assembled position within the lid 104. When the lid 104 is in a closed position, an outer surface 122 of the lid 104 is visible but the LCD display 118 and the bezel 120 are no longer visible to the user.

The portable computer 100 also includes a fan internal to the base 102. The fan, when activated, produces a significant flow of forced air through the base 102 to cool the base 102 and the electrical components therein. The base 102 also includes upper vents 124 and lower vents 125 in the base 102 so that the forced air, namely hot air, can be expelled from the base 102 of the portable computer 100. Although not shown in FIG. 1, the lower vents 125 extend primarily under the bottom surface of the base 102. These vents 124 and 125 are further explained below with respect to the first aspect of the invention. Other vents in the base 102 can provide for air intake.

The portable computer 100 further includes a push button latch 126. The push-button latch 126 is provided in the base 102 of the portable computer 100. By depressing the push button latch 126, the lid 104 is unlatched from the base 102 when in the closed position. The push button latch 126 is explained further below with respect to the second aspect of the invention.

In addition, the portable computer 100 includes a media bay that is accessible through a media bay opening 128 and an eject lever 130. A media device can be inserted into the media bay opening 128 to add functionality or capacity to the portable computer 100. After a media device is inserted into the media bay, the media device can be ejected by pulling one end of the eject lever 130 away from the surface of the base 102. The lever 130 and the ejection of the media device from the media bay is explained further below with respect to the third aspect of the invention.

According to the first aspect of the invention, a multi-axis ventilation system is provided for a computer system. In one embodiment, the multi-axis ventilation system includes a fan which directs air flow in a primary axis and in a secondary axis. The multi-axis ventilation system also includes a primary vent associated with the primary axis and a secondary vent associated with the secondary axis.

FIG. 2 is a partial cross-sectional diagram of a portable computer 200 according to one embodiment of the first aspect of the invention. The portion of the portable computer 200 illustrated in FIG. 2 corresponds to a back section of a base of the portable computer 200.

The portable computer 200 has a computer housing 202. The computer housing 202 has a top surface 204, a bottom surface 206, and a back surface 208. The portable computer 200 also includes an internal area 210. The internal area 210 includes integrated circuit chips, wiring and other circuitry or components associated with the base of the portable computer 200. The top surface 204 also receives a keypad 212 for user input to the portable computer 200. Although not shown, a display housing would typically be rotatably coupled to the base 202 near the back section of the portable computer 200.

In addition, the computer housing 202 also includes a bottom vent 214 located along the bottom surface 206, and a back vent 216 located along the back surface 208. The internal area 210 also includes a fan 218. The fan 218, as shown in FIG. 2, is positioned within the internal area 210 at an angle α. The angle α is approximately 15° from horizontal. More generally, the angle a is within the range of 10°–20°, and even more generally within the range of 10°–30°. The fan 218 also includes a notched opening 220. The notched opening 220 allows a secondary airflow 222 to be produced when the fan 218 is operational. Alternatively, the notched opening 220 could instead be a hole. In addition, a primary airflow 224 is produced when the fan 218 is operational. The fan 218 produces the primary airflow 224 along a primary axis and produces the secondary airflow 222 along a secondary axis. The secondary axis is substantially perpendicular to the primary axis. The secondary airflow 222 directs air through the back (secondary) vent 216 and the primary airflow 224 directs air through the bottom (primary) vent 214.

Accordingly, in this manner, the fan 218 operates to remove heated air from the internal area 210 of the portable computer 200 and expel the heated air through both the side vent 216 and the bottom vent 214. Accordingly, when the bottom vent 214 is blocked, the heated air can still be expelled form the computer housing 202 via the back vent. As noted above, the bottom vent 214 can, for example, become blocked when used on soft surfaces (e.g., carpets, blankets, pillows, foam surfaces, etc.). Although the volume of air would be decreased in this situation, the reduced volume of air would still provide adequate cooling.

The bottom vent 214 and the side vent 216 of the computer housing 202 can be provided in other positions than those shown in FIG. 2. For example, as shown in FIG. 1, the bottom vent 214 and the back vent 216 are other suitable positions for the primary and secondary vents, respectively. The size and number of vents provided within the computer housing 202 can also vary. The advantage of bottom vents is that they are largely or completely hidden from the user and provide an aesthetic appearance. Also, by directing the heated air into a desktop (or other surface supporting the portable computer 200), the fan 218 is less noisy to the user.

In the embodiment shown in FIG. 2, the fan 218 can be provided within the computer housing 202 without a baffle because the fan 218 is tightly fit within the computer housing 202. However, in other embodiments, it may be desirable to provide a baffle between the top surface of the computer housing 202 and the top surface of the fan 218 so that the airflow in the secondary direction exits the computer housing 202 through the secondary vent 216 and does not recirculate into the internal area 210 of the portable computer 200. Such a baffle can, for example, be integrated into an inner surface of the top surface of the computer housing 202 just above the fan 218. Further, a baffle could also improve airflow when the secondary vent 216 is not directly aligned with the secondary axis of the secondary airflow of the secondary airflow 222.

FIGS. 3A–3C are diagrams of a fan 300 according to one embodiment of the first aspect of the invention. FIG. 3A represents a top view of the fan 300, FIG. 3B represents a front view of the fan 300, and FIG. 3C represents a side view of the fan 300. The fan 300 is suitable for use as the fan 218 illustrated in FIG. 2. The fan 300 includes a fan housing 302 and a rotational wheel 304 that includes a plurality of blades 306. The rotational wheel 304 is provided within the fan housing 302. The rotational wheel 304 spins under the control of an electrical motor once supplied with power (e.g., 5 volts). When the rotational wheel 304 spins, the blades 306 produce an airflow. In addition, however, the fan 300 also includes a notch opening 308 (or hole) in one side of the fan 300. The notch opening 308 is also shown in FIG. 3B. The airflow produced by rotation of the rotational wheel 304 is provided in both a primary direction and a secondary direction. The primary airflow direction is shown in the horizontal direction in the side view of FIG. 3C. The secondary airflow is provided through the notch opening 308. The secondary airflow is also illustrated in FIG. 3C as being in the downward direction (i.e., through the notch 308).

The size and dimensions of the fan utilized with the first aspect of the invention vary with application and housing. By providing the fan at an angle, the fan is still able to more easily fit within thin base housings of portable computers. For example, for fan 300, the base can be 25×25×10 millimeters (length, width, height). The notch 308, for example, can be cut into one side with a length of 15 millimeters and a depth of 7.5 millimeters.

The advantages of the first aspect of the invention are numerous. Different embodiments or implementations may have one or more of the following advantages. One advantage of the invention is that a fan is mounted in a portable computer in a largely horizontal direction which enables a computer housing to be thin yet still include a fan. Another advantage of the invention is that the fan utilized produces airflow in two directions and in effect operates as a tube axial fan as well as a blower. Still another advantage of the invention is that the external appearance of the portable computer is improved because the primary vents for the expulsion of air can be on or proximate to a bottom surface of the computer housing, thus being largely hidden from a user's view and additional side (or back) vents can be provided in a limited fashion to enable cooling when the bottom vents are inhibited yet only minimally detract from visual appearance.

The second aspect of the invention pertains to a push button latch for a portable computer. The push button latch is provided in a base housing of the portable computer. In one embodiment, the push button latch is spring-based and any spring induced noise is substantially dampened. In another embodiment, elastomer bumpers can provide an initial push up.

Figure 4A:
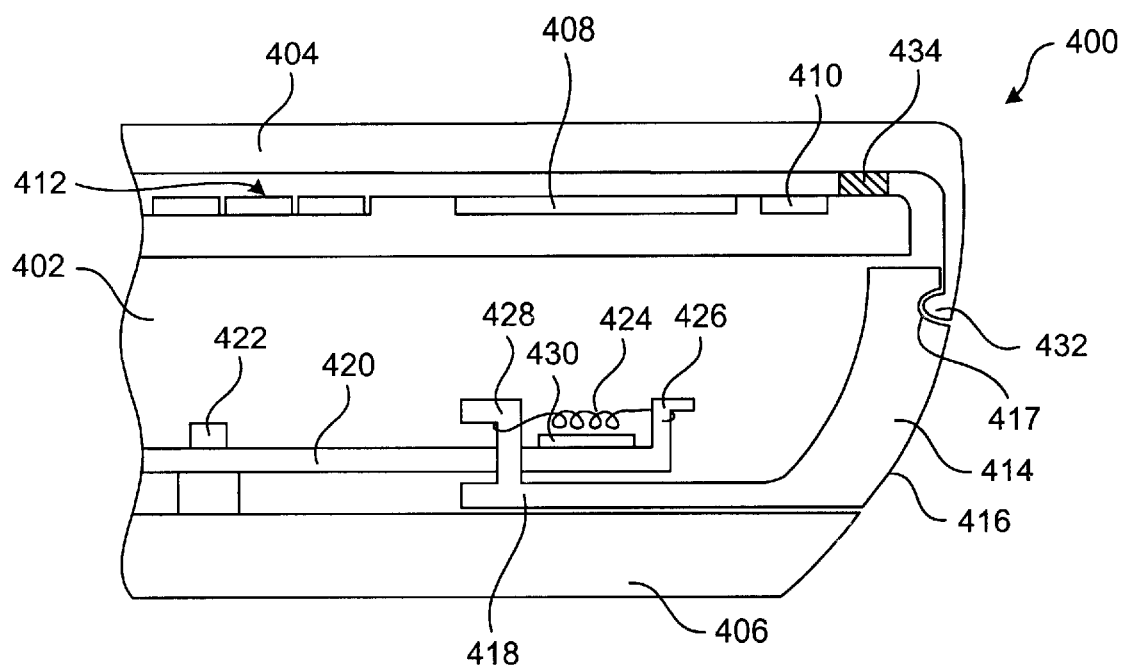
FIGS. 4A–4C pertain to a cross-sectional view of a portion of a portable computer where a front surface of a base housing includes a latch according to one embodiment of a second aspect of the invention.
Figure 4B:
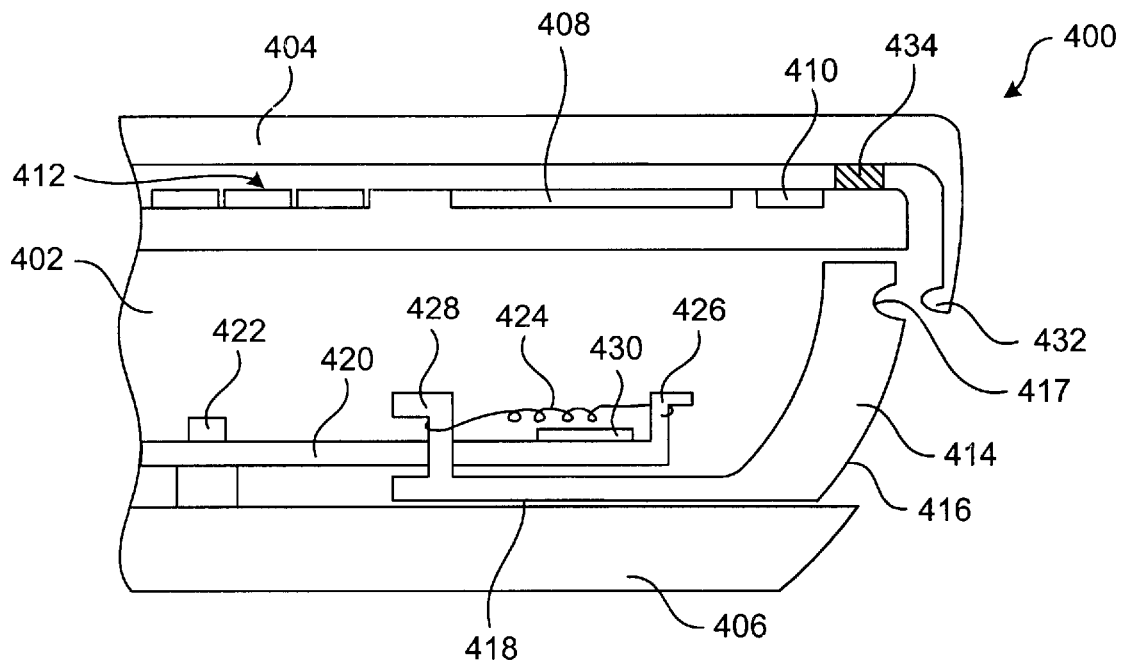
Figure 4C:
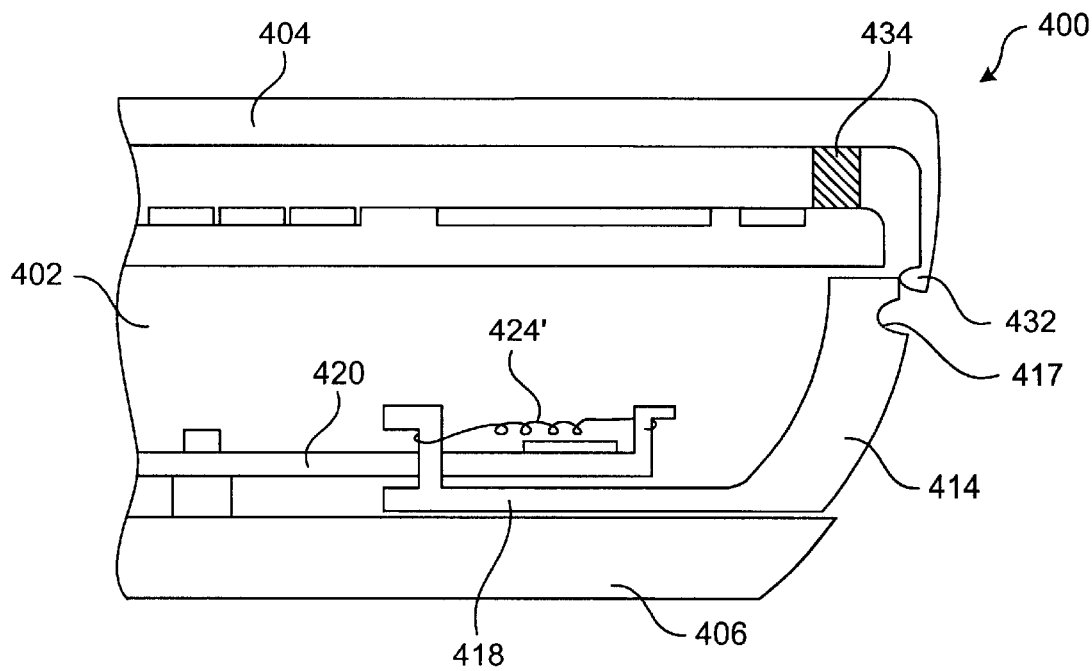

FIGS. 4A–4C pertain to cross-sectional views of a portion of a portable computer 400 where a front surface of a base housing latches against a top surface of a display housing according to one embodiment of the second aspect of the invention. A latch mechanism used to provide the latching is provided in the base housing and is push-button actuated.

In FIG. 4A, the portable computer 400 is shown in a closed position. The portable computer 400 includes a base housing 402 and a display housing (or lid) 404. As shown in FIG. 4A, the display housing 404 is latched to the base housing 402. The base housing 402 includes a top surface and a bottom surface 406. The top surface of the base housing 402 supports various components, including a track pad 408, a button 410 and a keypad 412.

The base housing 402 also includes a latch button 414 at a front surface of the base housing 402. In one embodiment, the portable computer 400 includes a single latch button provided at the center location of the front surface of the base housing 402. The latch button 414 is depicted in FIG. 4A in a latched position whereby the latch button 414 latches the display housing 404 in the closed position with respect to the base housing 402. In other words, once latched, the display housing 404 cannot be opened without unlatching the display housing 404 by depressing the latch button 414.

The latch button 414 includes an outer surface 416 that is essentially flush with the outer, front surface of the base housing 402. The latch button 414 also includes a notch 417 that engages a portion of the display housing 404 when the display housing 404 is latched with the base housing 402. An internal portion of the latch button 414 also includes a slider region 418. The slider region 418 slides within the base housing 402 in a direction towards a back surface of the base housing 402 when the latch button 414 is depressed. The slider region 418 is spring-biased so as to rebound to its rest position which is associated with the position at which the outer surface 416 of the latch button 414 is flush with the front surface of the base housing 402.

The base housing 402 also includes a fixed support 420 that is fixed within the base housing 402 using, for example, a pin (or stake) 422. The base housing 402 also includes a spring 424 having a first end connected to a fixed hook 426 of the fixed support 420 and having a second end connected to a sliding hook 428 of the slider region 418. Further, a foam pad 430 can also be provided below the spring 424 to provide acoustic dampening of any noise produced by the spring 424 during latching and unlatching operations.

FIG. 4B illustrates the portion of the portable computer 400 when the latch button 414 has been depressed. As shown in FIG. 4B, when the latch button 414 is depressed, the slider region 418 and its associated sliding hook 428 slide towards the rear of the portable computer 400 (i.e., back surface of the base housing 402) and thus slides with respect to the fixed support 420 and its fixed hook 426. As the slider region 418 slides towards the rear, the spring 424 is stretched to an elongated position and thus produces a return force that can return the latch button 414 to its rest position after the latch button 414 has been released. Also note in FIG. 4B that when the latch button 414 is depressed, the notch 417 no longer engages a protrusion 432 of the display housing 404 and thus the display housing 404 can be opened. The protrusion 432 is used to mesh with the notch 417 in the display latch 414 to latch the display housing in the closed position.

Additionally, the portable computer 400 can provide elastomer bumpers 434 between the front surface of the display housing 404 and the top surface of the base housing 402. When in the closed position, the elastomer bumpers 434 protect the top surface of the base housing 402 as well as the front surface of the display housing 404 from being marred or tarnished due to wearing against one another as opposing surfaces. Hence, the elastomer bumpers 434 provide a small stand off height to prevent direct contact of these opposing surfaces. Furthermore, the elastomer bumpers 434 can be used to push up, i.e., open, the display housing 404 with respect to the base housing 402 by a small distance when the latch button 414 is depressed. In other words, when the protrusion 432 disengages from the notch 417, the elastomer bumpers 434 can cause the display housing 404 to be partially opened to a small amount such that the protrusion 432 clears the notch 417. This partial opening not only prevents re-latching when the latch button 414 is released but also facilitates further opening of the display housing 404 by a user. As an example, the small distance is roughly on the order of a few millimeters.

In one embodiment, the return action of the latch button 414 can in fact also provide a force against the protrusion 432 that can further act to assist in partially opening the display housing 404. FIG. 4C illustrates the elastomer bumpers 434 in the state in which they are not being compressed by the latching action and re-latching has been prevented by the initial opening operation. As shown in FIG. 4C, the return action of the latch button 414 induces a force on the protrusion 432 that tends to partially open the display housing. The spring 424 causes the latch button 414 to want to return to its rest position which is its non-depressed state.

An additional feature of the second aspect of the invention is that a dampener can be provided on the latch button 414. Once released, a dampening action provided by the dampener would cause the latch button 414 to return to its rest position in a slow, controlled manner once released. Without the dampener, the latch button 414 would tend to return to the rest position abruptly (e.g., snap back). Thus, with a dampener, the latch button 414 would return to its rest position after being depressed in a slow controlled manner. A dampener can be provided against the slider region 418 of the latch button 414. For example, a geared dampener can be used, such as utilized below with respect to the third aspect of the invention.

The advantages of the second aspect of the invention are numerous. Different embodiments or implementations may have one or more of the following advantages. One advantage of the second aspect of the invention is that unlatching is easily achieved by user. The latch button provides a reasonably sized surface area that a user can easily locate and depress. Another advantage of the invention is that the latching mechanism is provided in the base housing of a portable computer which tends to be a thicker housing than a corresponding display housing. Still another advantage of the invention is that the front surface of the display housing of a portable computer need not include a hook or other aesthetically damaging protrusion associated with a latch mechanism provided in the display housing. Yet another advantage of the invention is that providing the latching mechanism in the base housing renders the latch mechanism much less vulnerable to user abuse than if provided in and protruding from the display housing.

According to the third aspect of the invention, a media bay ejection system is provided with a dampener to provide an improved lever return action. In one embodiment, the dampener is coupled to a push bar that ejects a media device by pushing it out of the computer housing using lever action.

Figure 5:
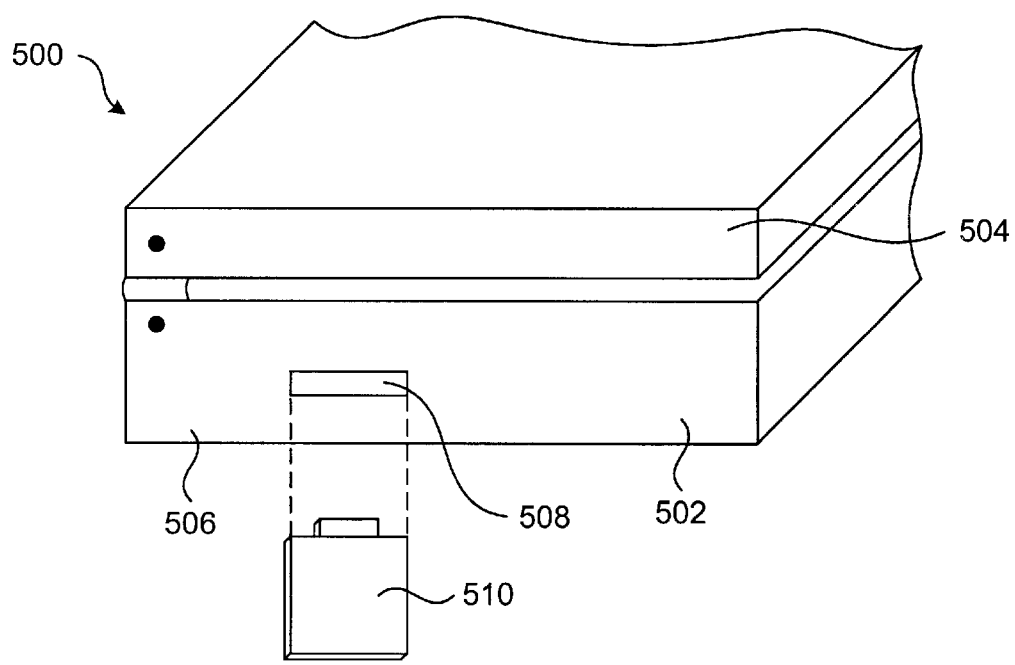
FIG. 5 is a diagram of a portion of a portable computer having a media bay.

FIG. 5 is a diagram of a portion of a portable computer 500. The portable computer 500 includes a base housing 502 and a display housing 504. Typically, a hinge mechanism at a back portion of the base housing 502 is coupled to a back portion of the display housing 504 using a hinge mechanism. The base housing 502 also includes a surface 506 that includes a media bay opening 508. The media bay opening 508 can receive a media device 510. In other words, the media device 510 can be inserted into the media bay opening 508. Once the media device 510 is inserted into the media bay opening 508, the functionality provided by the media device 510 becomes available for use by the portable computer 500. As examples, the media device 510 can be a digital versatile disk (DVD), a ZIP drive, a battery, audio CD drive, CD-ROM, or hard drive.

Figure 6A:
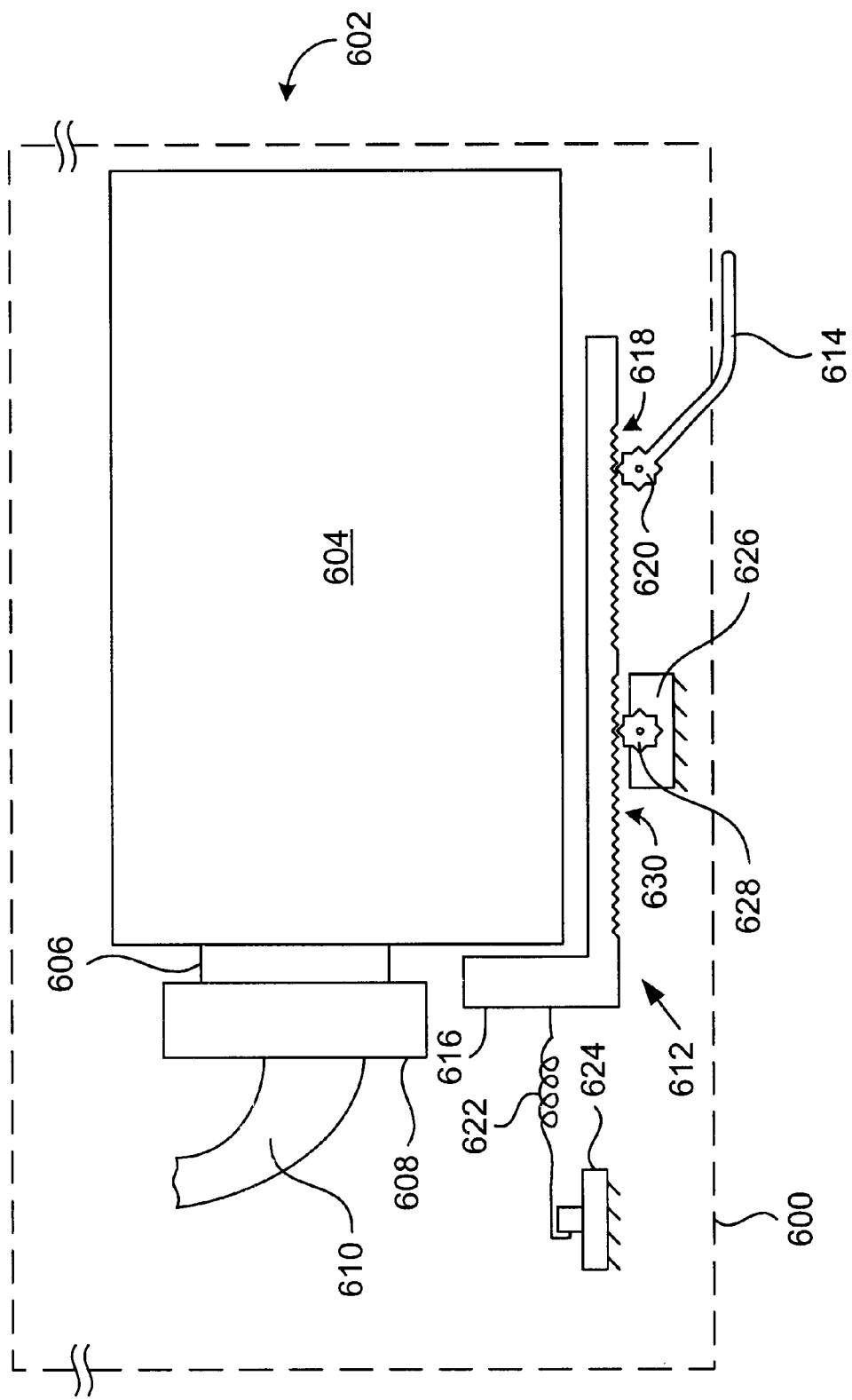
FIG. 6A is a diagram representing an internal portion of a base housing at an initial position according to one embodiment of a third aspect of the invention.

FIG. 6A is a diagram representing an internal portion of a base housing 600 according to one embodiment of the invention. The base housing 600, for example, can correspond to the base housing 502 illustrated in FIG. 5. The base housing 600 typically contains various electrical components that operate to provide the operation of the portable computer. These electrical components can include integrated circuit chips, circuit boards and discrete components. In addition, the base housing 600 includes a media bay opening 602. As an example, the media bay opening 602 can be the media bay opening 508 illustrated in FIG. 5. A media device 604 is shown in FIG. 6A as being inserted into the media bay opening 602. Hence, as shown in FIG. 6A, the media device 604 is fully inserted into the media bay opening 602. In the inserted position, a connector plug 606 of the media device 604 couples to a corresponding connector 608 within the base housing 600. The connector 608 is coupled to the various electrical components within the base housing 600 using a ribbon cable 610.

The internal section of the base housing 600 also includes a media ejection mechanism 612. The media ejection mechanism 612 operates to at least partially eject the media device 604 from the media bay opening 602. The media ejection mechanism 612 includes an eject lever 614. The eject lever 614 is accessible from the exterior of the base housing 600 by a user. That is, a user controls the media ejection mechanism 612 through use of the eject lever 614.

The media ejection mechanism 612 also includes a push bar 616. The push bar 616 is positioned adjacent to a portion of a rear surface of the media device 604 as well as along a corresponding side of the media device 604. The push bar 616 includes a toothed section 618 coupled to a gear section 620 of the eject lever 614. More particularly, the toothed section 618 meshes with the gear section 620 of the eject handle 614. When the eject lever 614 is moved, the gear section 620 working in conjunction with the toothed section 618 operates to move the push bar 616 such that the media device 604 is pushed outward from the media bay opening 602. The media ejection mechanism 612 also includes a spring 622. One end of the spring 622 is connected to the push bar 616 and the other end of the spring 622 is connected to a fixed surface 624 within the base housing 600. Still further, the media ejection mechanism 612 includes a dampener 626. The dampener 626 includes a gear 628 that couples with a toothed section 630 on the push bar 616. More particularly, the toothed section 630 meshes with the gear 628 of the dampener 626. The toothed section 630 could be the same as the toothed section 618.

When the eject lever 614 is pulled back away from the surface of the base housing 600 by a user, the interaction of the gear section 620 with the toothed section 618 of the push bar 616 causes the push bar 616 to move in the direction of the media bay opening 602. As the push bar 616 moves in the direction of the media bay opening 602, the media device 604 is dislodged from the connector 608 and also moved in the direction of the media bay opening 602. Moreover, as the push bar 616 moves towards the media bay opening 602, the spring 622 elongates and the gear 628 of the dampener 626 rotates in conjunction with its interaction with the toothed section 630.

Figure 6B:
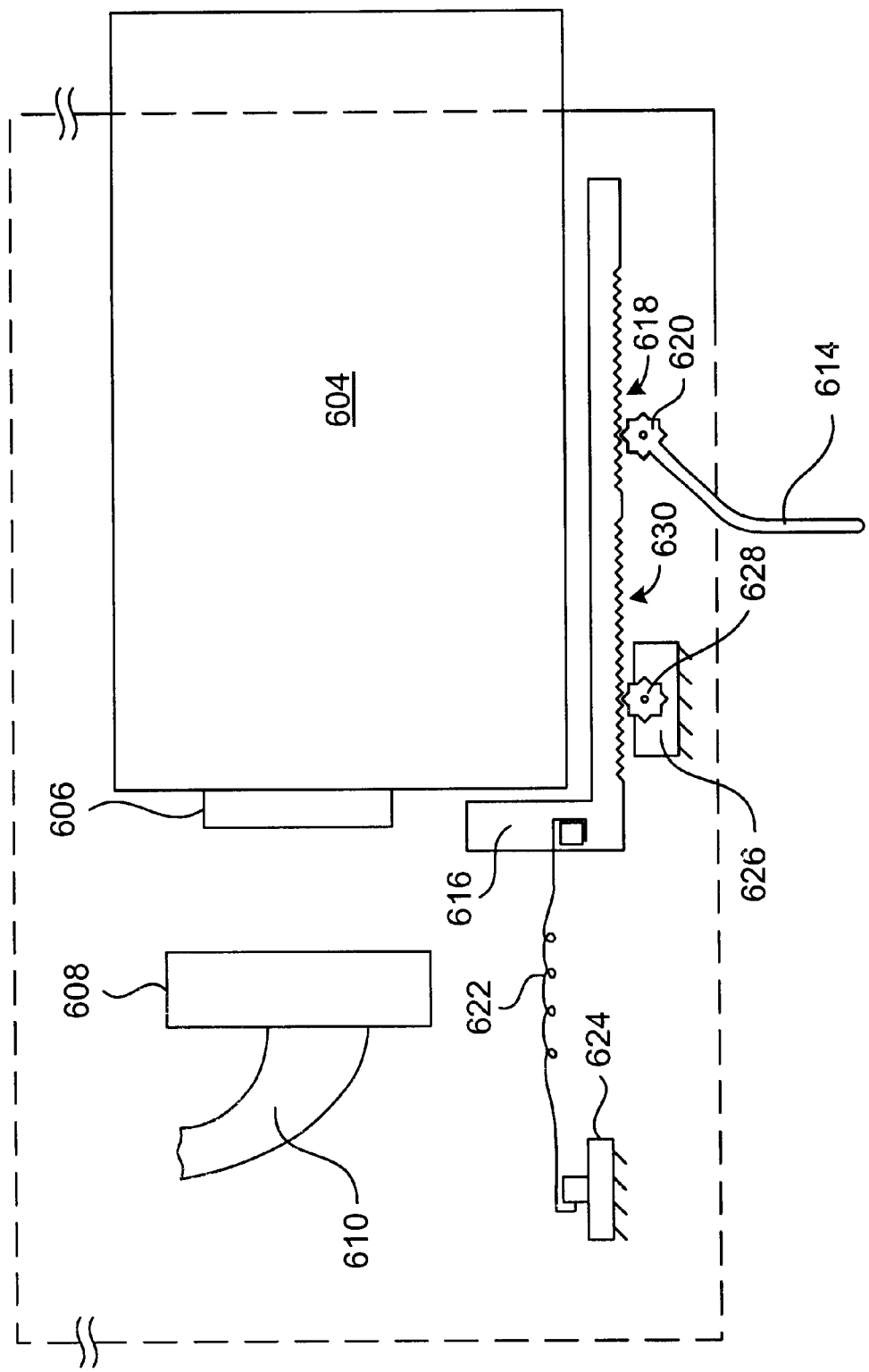
FIG. 6B is a diagram representing an internal portion of a base housing at an eject position according to one embodiment of a third aspect of the invention.

FIG. 6B is a diagram representing an internal portion of a base housing at an eject position according to one embodiment of a third aspect of the invention. More particularly, FIG. 6B illustrates the positioning of the eject lever 614, the push bar 616 and the media device 604 after the eject lever 614 has been pulled back from the surface of the base housing 600 (i.e., eject position or pulled back position). It should be noted that the media device 604 is dislodged from the connector 608 and also protruding outward from the media bay opening 602 in the base housing 600. Hence, from this position, the user is able to grasp the media device 604 and further remove it from the media bay opening 602. Once the eject lever 614 is released from its pulled back position, the spring 622, which is currently elongated, produces a force that pulls the push bar 616 back towards its initial position as shown in FIG. 6A. In this manner, the eject lever 614 will rotate back toward its initial position as also shown in FIG. 6A. However, to eliminate acoustic spring sounds and snap back and thus provide the appearance of a high quality device, the return of the push bar 616 and the eject lever 614 to their initial positions is done in a controlled manner. The dampener 626 is fixed with respect to the base housing 600 and during the return operation operates to cause the push bar 616 and, thus, the eject lever 614, to return to their initial positions in a slow and controlled manner. That is, the meshing of the tooth section 630 with the gear 628 of the dampener 626 is such that the turning of the gear 628 has a resistance that slows the return of the push bar 616 to its initial position. Consequently, there are no acoustic spring or snap noise problems and the eject lever 614 is prevented from immediately springing back but instead closes slowly to improve user satisfaction and enhance appearance of quality. In one embodiment, the dampener 626 includes a small propeller in a viscous liquid that resists rotation of the gear 628. As an example, one suitable dampener is part number RT-E2-400-G1 produced by ACE Controls of Farmington, Mich.

Most of the components of the media ejection mechanism 612 can be made from light-weight materials as is beneficial with portable computing devices. For example, the push bar 616 and the dampener 626 can be nylon products and the eject lever 614 can be a polycarbonate-ABS combination. However, various other materials can be utilized for the various components of the media ejection mechanism 612. The spring 622 can be a stainless steel spring or made from music wire. The spring 622 is designed to have enough return force to overcome friction, inertia and part imperfections. Normally, the minimum return force required for the spring 622 is sufficient to cause the eject lever 614 to snap back forcefully and to cause the spring to produce noise if not dampened. The dampener 626 is provided to prevent the forceful snap back and the spring noise. Although there is a dampening action, the return force of the spring 622 produces a torque that exceeds the resistance provided by the dampener 626. Even so, the dampener 626 does slow the rate of return (of the eject level 614 and the push bar 616) to an essentially constant speed independent of variations in geometry or surface quality of parts. Consequently, the resulting return action is a smooth, slow action that does not produce any noise and is consistent from unit to unit.

The advantages of the third aspect of the invention are numerous. Different embodiments or implementations may have one or more of the following advantages. One advantage of the invention is that the resulting portable computer conveys a higher quality impression to users. Another advantage of the invention is that acoustic noise associated with media ejection systems is significantly reduced.

A portable computer includes all computing devices that are capable of operating under battery power. Although the various aspects of the invention have been discussed above with respect to a portable computer, it should be recognized that these aspects of the invention could also be applied to other computing devices regardless of portability.

Further, although the first, second and third aspects are largely discussed separately, it should be recognized that one or all of these aspects can be combined together in the design of a computing device. Thus, a given housing for a computing device could incorporate one or more of the first, second and third aspects of the invention discussed above.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A portable computer, comprising:
   a media bay capable of receiving a media device; and
   a computer housing for components of said portable computer, said computer housing including at least
      a media bay opening providing access to said media bay; and
      a media ejection mechanism, said media ejection mechanism includes at least a push bar, a dampener and an eject lever, said dampener provides a resistance to rapid movement to said push bar and said eject lever.

2. A portable computer as recited in claim 1, wherein said push bar is spring-biased.

3. A portable computer as recited in claim 1, wherein the eject lever has at least an initial position and an eject position, and
   wherein a media device can be inserted into said media bay via said media bay opening while the eject lever is in the initial position, and thereafter the media device can be ejected from said media bay via said media bay opening by moving the eject lever from the initial position to the eject position.

4. A portable computer as recited in claim 3, wherein the eject lever slowly returns from the eject position to the initial position after being released.

5. A portable computer as recited in claim 3, wherein the spring-biased push bar causes the eject lever to return to the initial position, and the dampener causes the rate of the return to be limited.

6. A portable computer as recited in claim 1, wherein the push bar has a first toothed section and the dampener has a gear that meshes against the first toothed section.

7. A portable computer as recited in claim 6, wherein the push bar has a second toothed section and the eject lever has a gear that meshes against the second toothed section.

8. A portable computer as recited in claim 6, wherein said media ejection mechanism further includes a spring, and wherein said dampener further acoustically dampens spring noise.

9. A portable computer as recited in claim 6 wherein said dampener includes a viscous liquid that resists the rotation of said gear.

10. A portable computer as recited in claim 1 wherein said dampener allows said pull bar and said eject lever to return to their rest positions in a slow and controlled manner.

11. A portable computer as recited in claim 1 wherein said push bar is positioned inside said computer housing.

12. A portable computer as recited in claim 1 wherein the eject lever provides a pivot action.

13. A portable computer as recited in claim 1 wherein said push bar is attached to a spring that is connected to a fixed surface within the interior of said computer housing.

14. A computer, comprising:
   a display housing including a display;
   a media bay capable of receiving a media device; and
   a computer housing for components of said computer, said housing including at least
      a media bay opening providing access to said media bay; and
      media ejection means for dampening a return action of an ejection lever which ejects a media device from said media bay.

15. A media ejection mechanism for ejecting a media device from a media bay, said media ejection mechanism comprising:
   an eject lever that moves between an initial position and an ejection position so as to at least partially eject the media device from the media bay;
   a spring having a return force that moves the eject lever to its initial position; and
   a dampener for providing a resistance to the return force so as to allow the eject lever to move to its initial position in a slow and controlled manner.

16. A media ejection mechanism as recited in claim 15 wherein said dampener substantially eliminates acoustic spring sounds or snap back of the eject lever, which are produced by said spring.

17. A media ejection mechanism as recited in claim 15 further including a push bar that cooperates with said eject lever to at least partially eject said media device from said media bay.

18. A media ejection mechanism as recited in claim 17 wherein said eject lever is operatively coupled to said push bar, and wherein the eject lever operates to move the push bar between a first position for receiving the media device in the media bay, and a second position for at least partially ejecting the media device from the media bay.

19. A media ejection mechanism as recited in claim 18 wherein said initial position of said eject lever corresponds to said first position of said push bar, and wherein said ejection position of said eject lever corresponds to said second position of said push bar.

20. A media ejection mechanism as recited in claim 18 wherein said push bar is configured to push said media device out of said media bay upon actuation of said ejection lever.

21. A media ejection mechanism as recited in claim 18 wherein said spring is connected to said push bar and to a fixed surface of a housing that contains said media bay.

22. A media ejection mechanism as recited in claim 21 wherein said return force of said spring pulls said push bar to its first position thereby placing said ejection lever in its initial position.

23. A media ejection mechanism as recited in claim 17 wherein said dampener is operatively coupled to said push bar.

24. A media ejection mechanism as recited in claim 17 wherein said ejection lever pivots and said push bar translates.

25. A media ejection mechanism as recited in claim 15 wherein said return force exceeds said resistance by a small amount so as to allow said eject lever to move to its initial position in said slow and controlled manner.

26. A method for controlling the movement of an eject lever used to eject a media device from a media bay, comprising;
   continuously biasing the eject lever into an initial position via a return force; and
   dampening the return force so as to allow the eject lever to move to its initial position in a slow and controlled manner.

* * * * *